United States Patent
AlJuffri et al.

(10) Patent No.: US 9,594,629 B2
(45) Date of Patent: Mar. 14, 2017

(54) DATA ERROR CORRECTION FROM CACHED ERROR CORRECTION INFORMATION

(71) Applicant: King Abdulaziz City for Science and Technology, Riyadh (SA)

(72) Inventors: Abdullah Alawi AlJuffri, Riyadh (SA); Mohammed Sulaiman BenSaleh, Riyadh (SA); Abdulfattah Mohammad Obeid, Riyadh (SA); Syed Manzoor Qasim, Riyadh (SA)

(73) Assignee: KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 86 days.

(21) Appl. No.: 14/729,749

(22) Filed: Jun. 3, 2015

(65) Prior Publication Data

US 2016/0357627 A1    Dec. 8, 2016

(51) Int. Cl.
*H03M 13/00*    (2006.01)
*G06F 11/10*    (2006.01)
(Continued)

(52) U.S. Cl.
CPC ...... *G06F 11/1064* (2013.01); *G06F 11/1068* (2013.01); *G11C 29/52* (2013.01);
(Continued)

(58) Field of Classification Search
CPC ............. G06F 11/1064; G06F 11/1068; G06F 11/1016; G11C 29/52; G11C 2029/0411;
(Continued)

(56) References Cited

U.S. PATENT DOCUMENTS 5,666,369 A * 9/1997 Nakamura .......... H03M 13/151
714/781
7,296,213 B2   11/2007 Vainsencher et al.
(Continued)

FOREIGN PATENT DOCUMENTS

WO    WO-2014051797    4/2014
WO    WO-2014137202    9/2014

OTHER PUBLICATIONS

Lee et al., "High-Throughput and Low-Complexity BCH Decoding Architecture for Solid-State Drives", IEEE Transactions, vol. 22, Issue 5, 2014, pp. 1183-1187.
(Continued)

*Primary Examiner* — Guerrier Merant
(74) *Attorney, Agent, or Firm* — Andrew M. Calderon; Roberts Mlotkowski Safran Cole & Calderon, P.C.

(57) ABSTRACT

A computing device for correcting data errors may receive data stored by a memory device; calculate a syndrome associated with the data; initiate a calculation of error correction information for the data based on the syndrome; search for the error correction information in a cache based on the syndrome; discontinue the calculation of the error correction information when the error correction information is found in the cache before the error correction information is calculated; and correct an error associated with the data using the error correction information from the cache.

20 Claims, 3 Drawing Sheets

(51) Int. Cl.
*H03M 13/15* (2006.01)
*G11C 29/52* (2006.01)

(52) U.S. Cl.
CPC ..... *H03M 13/153* (2013.01); *H03M 13/1545* (2013.01); *H03M 13/1575* (2013.01)

(58) Field of Classification Search
CPC ........... H03M 13/153; H03M 13/1545; H03M 13/1575; H03M 13/1515; H03M 13/152; H03M 13/1525; H03M 13/151; H03M 13/159
See application file for complete search history.

(56) References Cited

U.S. PATENT DOCUMENTS

| | | | |
|---|---|---|---|
| 7,844,880 B2 | 11/2010 | Vainsencher et al. | |
| 7,900,122 B2 | 3/2011 | Shen et al. | |
| 8,312,348 B2 | 11/2012 | Yamaga | |
| 8,429,329 B2 | 4/2013 | Pekny et al. | |
| 8,464,137 B2 | 6/2013 | Franceschini et al. | |
| 8,612,834 B2 | 12/2013 | Kwok et al. | |
| 8,667,368 B2 | 3/2014 | Gupta et al. | |
| 2004/0181735 A1* | 9/2004 | Xin | H03M 13/152 714/758 |
| 2010/0241932 A1* | 9/2010 | Sakaue | G06F 11/1016 714/784 |

OTHER PUBLICATIONS

Spinner et al., "A BCH Decoding . . . Degrees for Flash Controller Applications", SOC Conference (SOCC), 2013 IEEE 26th International, pp. 116-121.

Cho et al., "Efficient Software-Based Encoding and Decoding of BCH Codes", IEEE Transactions on Computers, vol. 58, No. 7, Jul. 2009, abstract.

Choi et al., "VLSI Implementation of BCH Error Correction for Multilevel Cell NAND Flash Memory", IEEE Transactions on VLSI Systems, vol. 18, No. 5, May 2010, abstract.

Choi et al., "VLSI Implementation of BCH Error Correction for Multilevel Cell NAND Flash Memory", IEEE Transactions on VLSI Systems, vol. 18, No. 5, May 2010, pp. 843-847.

Cho et al., "Efficient Software-Based Encoding and Decoding of BCH Codes", IEEE Transactions on Computers, vol. 58, No. 7, Jul. 2009, pp. 878-889.

* cited by examiner

DATA ERROR CORRECTION FROM CACHED ERROR CORRECTION INFORMATION

FIELD OF THE INVENTION

The invention relates to error correction processes for NAND flash memory, and more particularly, to finding error correction information using a cache, for NAND flash memory data.

BACKGROUND

Flash memory is commonly used in many electronic systems. Flash memory is used to store program and data information and allow updating firmware in the field when a product is already deployed. Flash memory allows storing a substantial number of files in a small single chip. Flash memory was developed from electrically erasable programmable read-only memory (EEPROM). There are two main types of flash memory, which are named after the NAND and NOR logic gates. The internal characteristics of individual flash memory cells exhibit characteristics similar to those of the corresponding gates.

NOR flash memory is widely used as a direct replacement for regular read only memory (ROM). NAND flash memory uses a different memory access approach, different interface and specific operation requirements. NAND flash memory is often used in applications having large storage requirements. NAND flash memory can store data as well as program information with high data reliability. NAND flash memory can work as a replacement for rotating media storage devices which can be impractical in high mechanic shock environments.

NAND flash memory does not allow random access to any location in the memory. Instead, groups of bytes called pages are requested. In a read operation, the requested page is internally transferred from a flash matrix into a page register from where page data can be accessed in a serial-like manner, byte by byte, starting from the byte at the indicated location within the page. The address within the active page can be freely changed to read other bytes from the given memory page. Changing a page address requires re-executing the matrix read command.

Pages are grouped into blocks which are the smallest area than can be erased. A single page is the smallest region that can be programmed. Blocks are organized in planes and planes in logic units (LUN).

NAND flash memory devices are commonly used as a replacement for traditional hard drives. NAND flash memory devices, such as solid-state drives (SSDs), do not have the mechanical limitations and latencies of traditional hard drives. Thus, NAND flash memory devices generally exhibit better performance than traditional hard drives, such as read/write speed, noise, power consumption, and reliability. NAND flash memory devices are often used in a wide variety of computing environments, such as mobile devices, desktop computers, laptop computers, servers, and storage systems with redundant array of inexpensive disks (RAID) and storage area network (SAN) architectures.

Various noise sources exist in NAND flash memory devices, such as random-telegraph noise, retention process, inter-cell interference, background pattern noise, read/program disturb, etc. Such noise sources reduce the storage reliability of flash memory significantly. The continuous bit cost reduction of NAND flash memory devices mainly relies on aggressive technology scaling and multi-level per cell technique. These techniques, however, further deteriorate the storage reliability of NAND flash memory. For example, the typical storage reliability requirement is that non-recoverable bit error rate (BER) must be below $10^{-15}$. Such stringent BER requirement makes error-correcting code (ECC) techniques mandatory to guarantee storage reliability.

Bose, Chaudhuri, Hocquenghem (BCH) is one of the error correction solutions that are used in NAND flash memory devices to read/receive data stored in NAND flash memory. The decoding process of BCH includes calculating syndromes for a received vector, determining the quantity of errors and error locator polynomials from the syndromes using the Berlekamp-Massey algorithm, calculating the roots of the error location polynomial to find the error locations using the Chien-search algorithm, and calculating the error values at those error locations.

SUMMARY

In an aspect of the invention, a method may include calculating, by a computing device, a syndrome associated with stored data; initiating, by the computing device, a calculation of error correction information for the stored data based on the syndrome; searching, by the computing device, for the error correction information in a cache based on the syndrome; discontinuing, by the computing device, the calculation of the error correction information when the error correction information is found in the cache before the error correction information is calculated; and correcting, by the computing device, an error associated with the stored data using the error correction information from the cache.

In an aspect of the invention, a computer program product for correcting data errors may include a computer readable storage medium having program instructions embodied therewith. The computer readable storage medium is not a transitory signal per se. The program instructions are executable by a computing device to cause the computing device to perform a method including: receiving a data array; determining a syndrome associated with the data array; calculating error correction information for the data array based on the syndrome; counting a number of calculation cycles used to complete calculation of the error correction information; correcting, by the computing device, an error associated with the data array using the error correction information; and storing the error information in a cache when the number calculation cycles exceeds a threshold.

In an aspect of the invention, a computer program product for correcting data errors may include a computer readable storage medium; first program instructions to cause a computing device to receive data stored by the computer readable storage medium; second program instructions to cause the computing device to determine a syndrome associated with the data; third program instructions to cause the computing device to initiate a calculation of error correction information for the data based on the syndrome; fourth program instructions to cause the computing device to search for the error correction information in a cache based on the syndrome; fifth program instructions to cause the computing device to discontinue searching for the error correction information in the cache when the calculation of the error correction information is completed prior to finding the error correction information in the cache; and sixth program instructions to cause the computing device to correct an error associated with the data using the error correction information. The first program instructions, second program instructions, third program instructions, fourth program instructions, fifth program instructions, and sixth program instructions are stored in the computer readable storage medium.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to error correction processes for NAND flash memory, and more particularly, to finding error correction information using a cache, for NAND flash memory data. More specifically, the invention is directed to reducing the amount of time for decoding, e.g., correcting errors, NAND flash memory data by storing error correction information in a cache based on a number of cycles using a standard error correction process.

Advantageously, embodiments of the present invention may reduce the amount of time needed for finding and correcting errors for NAND flash memory data compared to using a standard error correction process (e.g., a BCH process). For example, by storing error correction information for flash memory data associated with a particular syndrome in a cache, the finding of such error correction information can be more efficient than calculating the error correction information using the Berlekamp-Massey and the Chien-search algorithms, alone. As used herein, the term "error correction information" may refer to information regarding error locations, error values, and/or other information used to correct transmission errors for data, e.g., NAND flash memory data.

In embodiments, error correction information for a particular syndrome may be stored in the cache based on the number of calculation cycles needed to calculate the error correction information using the Berlekamp-Massey and the Chien-search algorithms. For example, the error correction information may be calculated using the Berlekamp-Massey and the Chien-search algorithms, and subsequently stored in the cache if the number of calculation cycles needed to calculate the error correction information exceeds a predetermined threshold. In embodiments, the setting of the threshold to a certain value will prevent error correction information from being needlessly stored in cache, when the error correction information can be calculated with a relatively few number of calculation cycles. This will save storage space in the cache, while keeping the cache storage available for error correction information that may require a relatively high number calculation cycles to be calculated.

In embodiments, by saving the error correction information, the next time the NAND flash data with a particular syndrome is received, the error correction information for that particular syndrome can be obtained from the cache. Thus, error correction information that takes a substantial amount of time and/or cycles to calculate using Berlekamp-Massey and the Chien-search algorithms may be retrieved from the cache to reduce the amount of time to determine the error correction information.

Figure 1:
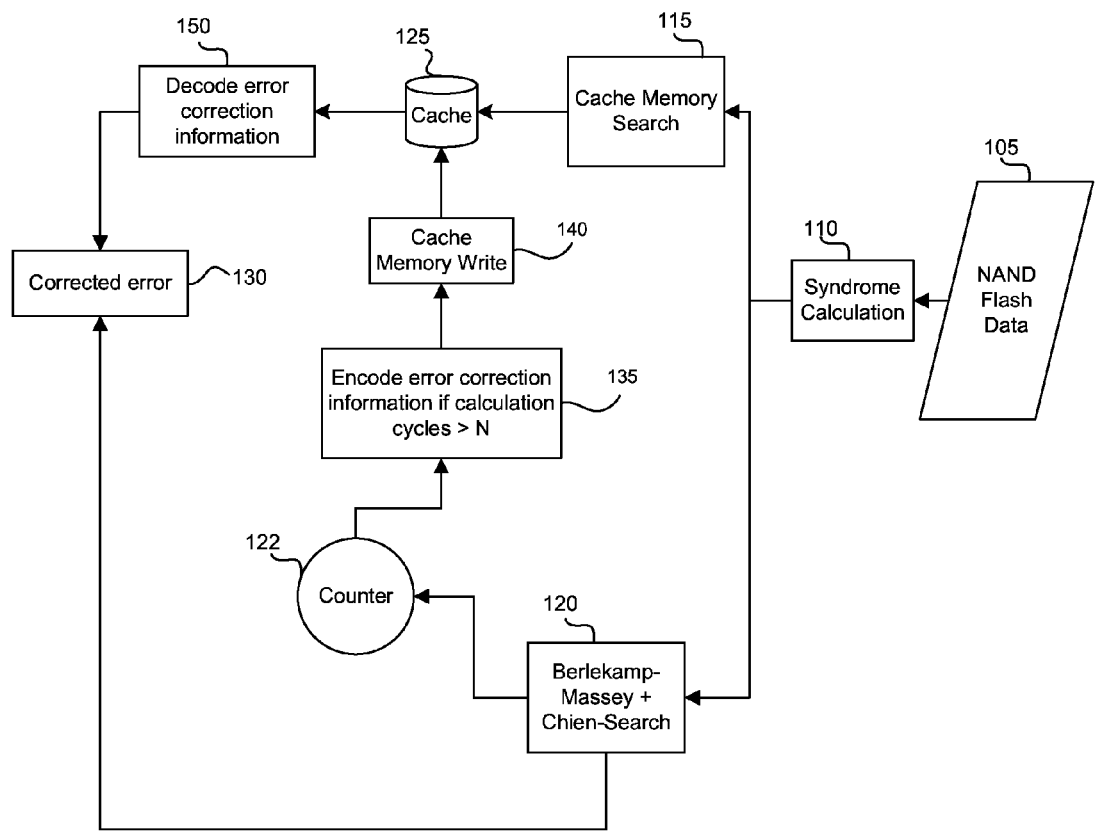
FIG. 1 shows a block diagram of an error correction and cache storage process in accordance with aspects of the present invention.
Figure 2:
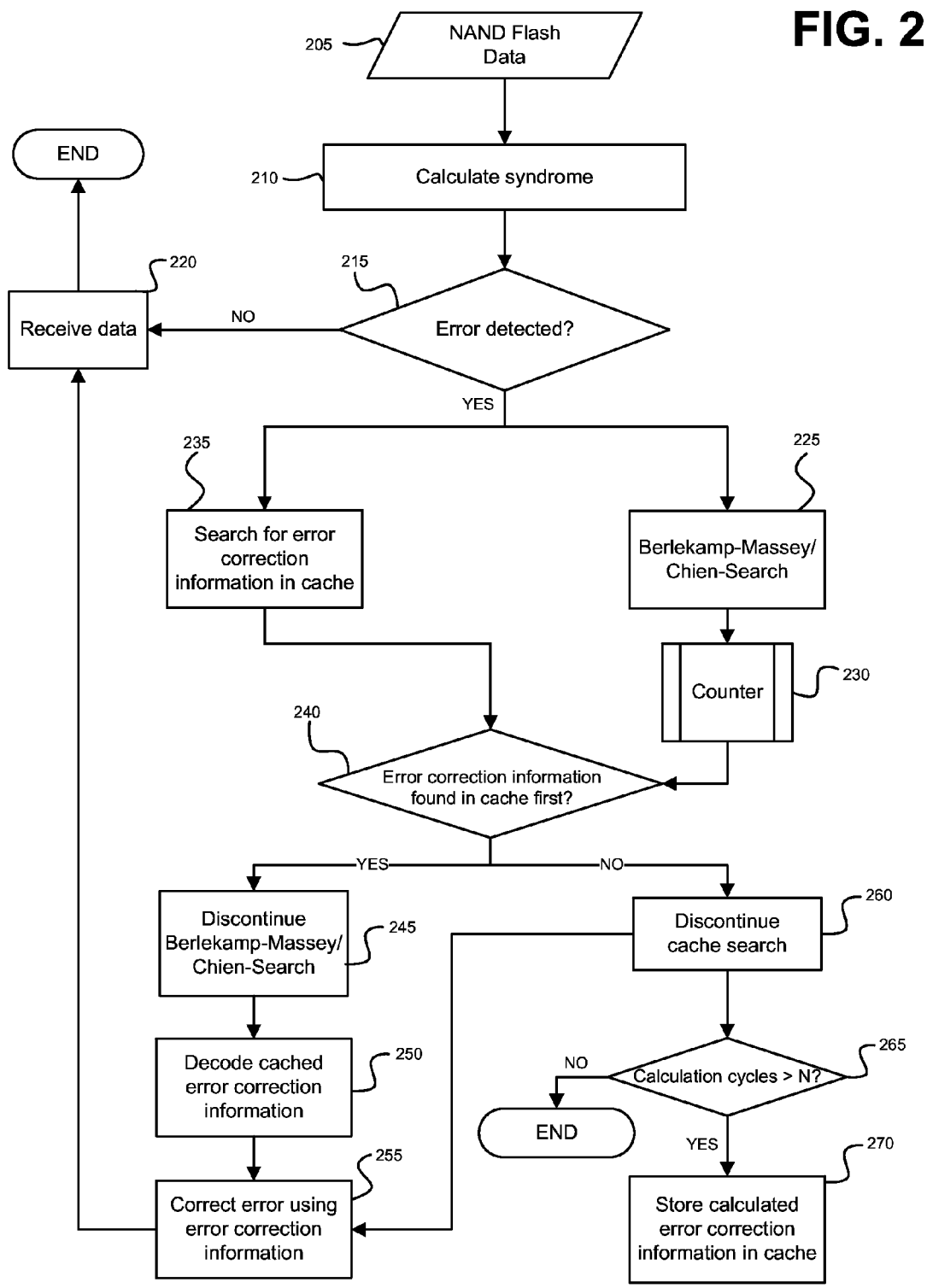
FIG. 2 shows a flowchart of an error correction and cache storage process in accordance with aspects of the present invention.

FIGS. 1 and 2 show a block diagram and a flowchart, respectively, of processes and systems in accordance with aspects of the present invention. The block diagram and flowchart of FIGS. 1 and 2 illustrate the architecture, functionality, and operation of possible implementations of systems, methods, and computer program products according to various embodiments of the present invention. In this regard, each block may represent a module, segment, or portion of instructions, which comprises one or more executable instructions for implementing the specified logical function(s).

It will also be noted that the processes described herein or any combinations thereof can be implemented by special purpose hardware-based systems that perform the specified functions or acts or carry out combinations of special purpose hardware and computer instructions. The process described herein can be implemented as a computer program product which may include a computer readable storage medium (or media) having computer readable program instructions thereon for causing a processor to carry out aspects of the invention. The computer readable storage medium is any physical storage medium or device and should not be interpreted as a non-transient signal, per se.

FIG. 1 shows a block diagram of an error correction and cache storage process, in accordance with aspects of the present invention. As shown in FIG. 1, at block 110, a syndrome for a data array, e.g., NAND flash data 105, may be calculated using conventional processes. For example, the syndrome may be calculated using Hamming Decoding and/or other syndrome calculation or decoding techniques. In embodiments, a vector, value, identifier, and/or sequence representing the syndrome may be determined at this stage.

At the same time, the syndrome may be searched in cache 125 at block 115, and calculated using the Berlekamp-Massey and the Chien-search algorithms at block 120. In embodiments, cache 125 stores data structures from previous search cycles that identify error correction information based on syndromes as described herein.

By way of illustrative example, as the error correction information is being calculated using the Berlekamp-Massey and the Chien-search algorithms, counter 122 may count the number of calculation cycles used to calculate the error correction information. As described herein, the number of calculation cycles may be used to determine whether the calculated error correction information should be stored in cache 125. In embodiments, if the error correction information is not calculated in block 120 by a certain number of N cycles as calculated at counter 122, the error correction information can be encoded at block 135 and written in the cache memory at block 140 for future search and retrieval. In embodiments, the error correction information may be encoded to reduce the amount of storage size of the error correction information.

In embodiments, the threshold N may be a design decision based on a size of cache 125. For example, a relatively larger value for N would reduce the storage size requirement for cache 125. A relatively smaller value for N would reduce the number of calculation cycles needed before either finding the error correction information in cache 125, or calculating the error correction information using the Berlekamp-Massey and the Chien-search algorithms. In this way, when the same syndrome is calculated for another NAND flash data array at a later time, the error correction information for that syndrome may be retrieved from cache 125, thereby reducing the amount of time needed to calculate the error correction information using the Berlekamp-Massey and the Chien-search algorithms.

In implementation, if the calculation of the error correction information is completed prior to the completion of the cache search, at block 130, NAND flash data 105 may be corrected using the calculated error correction information. On the other hand, if the error correction information is found in cache, prior to the completion of the calculation at block 120, then the calculation of the error correction information using the Berlekamp-Massey and the Chien-search algorithms is stopped, and the information from the cache is then decoded at block 150.

At block 150, the error correction information may be decoded from cache 125, e.g., since the error correction information may be stored in an encoded format. At block 130, NAND flash data 105 may be corrected using the decoded error correction information. Thus, the error correction information may be obtained from cache 125 instead of using the Berlekamp-Massey and the Chien-search algorithms. Accordingly, by implementing the systems and processes described herein, for error correction information that takes a substantial number of cycles to obtain, obtaining the error correction information from cache 125 can be faster and less processor-intensive than when the error correction information is calculated using the Berlekamp-Massey and the Chien-search algorithms.

FIG. 2 is a flowchart of an error correction and cache storage process in accordance with aspects of the present invention. At step 210, a syndrome for NAND flash data 205 may be calculated, e.g., when an array or data block associated with NAND flash data 205 is received. For example, the syndrome may be calculated using Hamming Decoding and/or other syndrome calculation or decoding techniques. In embodiments, a vector, value, identifier, and/or sequence representing the syndrome may be determined. In embodiments, a syndrome of zero ("0") may be calculated if no syndromes or errors are detected in NAND flash data 205.

At step 215, a determination is made as to whether an error has been detected based on the syndrome calculation at step 210. For example, if no syndrome was found, e.g., step 215—NO, then a determination is made that no error has been detected for NAND flash data 205. At step 220, NAND flash data 205 may be received, e.g., without the need to perform error correction on NAND flash data 205, since no error was detected.

If, on the other hand, an error has been detected (step 215—YES), error correction information may start to be calculated from the syndrome using the Berlekamp-Massey and the Chien-search algorithms (step 225), and, at step 230, a counter may be started. As described herein, the counter may count the number of cycles needed to calculate the error correction information corresponding to the syndrome using the Berlekamp-Massey and the Chien-search algorithms. For example, each time a calculation cycle is completed, the counter may increment by 1. At the same time when calculating the error correction information using the Berlekamp-Massey and the Chien-search algorithms, the error correction information, may be searched in a cache at step 235. For example, a syndrome value, corresponding to the error correction information, may be searched in the cache.

At step 240, a determination may be made as to whether the error correction information is found in the cache first, e.g., prior to the calculation of the error correction information using the Berlekamp-Massey and the Chien-search algorithms. For example, if the error correction information is stored in the cache and is retrieved prior to calculating the error correction information using the Berlekamp-Massey and the Chien-search algorithms, at step 240—YES, the process continues to step 245. Note that if the Berlekamp-Massey and the Chien-search algorithms exceed a certain number of cycles, though, and if the error correction information is not yet found in the cache, then the error correction information will be stored in cache as shown in steps 265 and 270.

When the error correction information is stored in the cache and is retrieved prior to calculating the error correction information using the Berlekamp-Massey and the Chien-search algorithms, at step 245 the Berlekamp-Massey and the Chien-search algorithms are stopped. At step 250, the cached error correction information may be decoded. At step 255, the error may be corrected using the decoded error correction information, and, at step 220, the corrected data may be received, thereby ending the error correction process.

If, on the other hand, the error correction information is found using the Berlekamp-Massey and the Chien-search algorithms before the syndrome value is found in the cache, step 240—NO, the cache search may be stopped at step 260. In embodiments, the error correction information is calculated using the Berlekamp-Massey and the Chien-search algorithms before the error correction information is found in the cache if the error correction information is not stored in the cache. At step 255, the error for NAND flash data 205 may be corrected using the error correction information calculated using the Berlekamp-Massey and the Chien-search algorithms, and, at step 220, the corrected data may be received, thereby ending the error correction process.

Further, at step 265, a determination is made as to whether the number of calculation cycles, used to calculate the error correction information, exceeds a threshold N. For example, the determination may be made as to whether the number of calculation cycles exceeds the threshold N based on the number of calculation cycles counted by the counter at step 230. If the number of calculation cycles exceeds the threshold, at step 265—YES, the calculated error correction information may be stored in the cache at step 270. In embodiments, the error correction information may be encoded prior to storage in the cache, e.g., to reduce the size of the error correction information. If, on the other hand, the number of calculation cycles does not exceed the threshold, at step 265—NO, the calculated error correction information may not be stored in the cache, thereby ending the error correction process.

As described herein, embodiments of the present invention may reduce the amount of time needed for correcting errors for NAND flash memory data in relation to the time needed to correct errors for NAND flash memory data using a standard error correction process (e.g., a BCH process). For example, error correction information, e.g., error locations and error values, for flash memory data associated with a particular syndrome can be found in a cache, which may be faster than calculating the error correction information using Berlekamp-Massey and the Chien-search algorithms. In embodiments, error correction information may only be stored in the cache when the number of calculation cycles, used to calculate the error correction information using Berlekamp-Massey and the Chien-search algorithms, exceeds a threshold. This threshold may prevent error correction information that may be calculated with a relatively few number of calculation cycles from consuming storage space in the cache, while keeping the cache storage available for error correction information that may require a relatively high number calculation cycles to be calculated.

Figure 3:
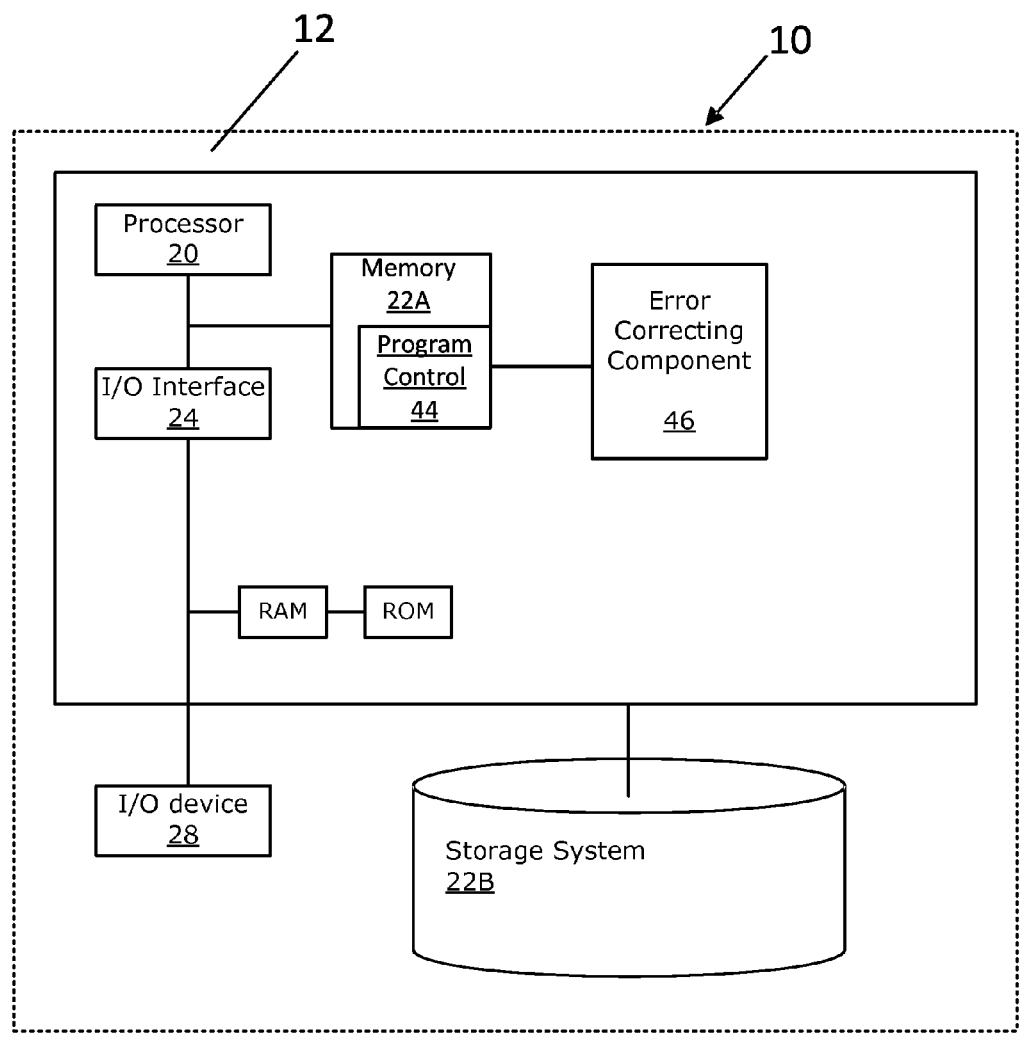
FIG. 3 shows an illustrative environment for implementing the steps in accordance with aspects of the invention.

FIG. 3 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider (any of which is generally represented in FIG. 3).

The computing device 14 includes a processor 20 e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code e.g., program control 44), which can be stored in memory 22A and/or storage system 22B. Moreover, in accordance with aspects of the invention, program control 44 controls an error correcting component 46, e.g., the processes described herein. For example, error correcting component 46 can implement the processes shown of FIGS. 1 and 2. The error correcting component 46 can be implemented as one or more program code in program control 44 stored in memory 22A as separate or combined modules. Additionally, the error correcting component 46 may be implemented as separate dedicated processors or a single or several processors to provide the function of these tools. While executing the computer program code, the processor 20 can read and/or write data to/from memory 22A, storage system 22B, and/or I/O interface 24. Storage system 22B can include information associated with the cache, as described herein. The program code executes the processes of the invention, which can be provided as a computer program product stored on the computer readable storage medium. The bus 26 provides a communications link between each of the components in computing device 14.

The computing device 14 can comprise any general purpose computing article of manufacture capable of executing computer program code installed thereon e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks e.g., the Internet, a wide area network, a local area network, a virtual private network, etc.); and/or utilize any combination of transmission techniques and protocols.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
calculating, by a computing device, a syndrome associated with stored data;
initiating, by the computing device, a calculation of error correction information for the stored data based on the syndrome;
searching, by the computing device, for the error correction information in a cache based on the syndrome;
discontinuing, by the computing device, the calculation of the error correction information when the error correction information is found in the cache before the error correction information is calculated; and
correcting, by the computing device, an error associated with the stored data using the error correction information from the cache.

2. The method of claim 1, further comprising:
discontinuing searching for the error correction information in the cache when the error correction information is calculated prior to finding the error correction information in the cache; and
storing the error correction information in the cache when a number of calculation cycles used to calculate the error correction information exceeds a threshold,
wherein correcting the error is based on calculating the error correction information.

3. The method of claim 2, further comprising encoding the error correction information prior to storing the error correction information in the cache.

4. The method of claim 1, wherein the calculation of the error correction information is based on at least one of a Berlekamp-Massey and Chein-Search algorithm.

5. The method of claim 1, further comprising decoding the error correction information from cache, wherein correcting the error is based on decoding the error correction information.

6. The method of claim 1, wherein determining whether the error correction information is stored in a cache includes searching the cache for a value associated with the syndrome.

7. The method of claim 1, wherein the stored data includes NAND flash data.

8. The method of claim 1, wherein the syndrome is calculated using a Hamming Decoding algorithm.

9. A computer program product for correcting data errors, the computer program product comprising a computer readable storage medium having program instructions embodied therewith, wherein the computer readable storage medium is not a transitory signal per se, the program instructions executable by a computing device to cause the computing device to perform a method comprising:
    receiving a data array;
    determining a syndrome associated with the data array;
    calculating error correction information for the data array based on the syndrome;
    counting a number of calculation cycles used to complete calculation of the error correction information;
    correcting, by the computing device, an error associated with the data array using the error correction information; and
    storing the error information in a cache when the number calculation cycles exceeds a threshold.

10. The computer program product of claim 9, wherein the method further comprises encoding the error correction information prior to storing the error correction information in the cache.

11. The computer program product of claim 9, wherein the calculation of the error correction information is based on at least one of a Berlekamp-Massey and Chein-Search algorithm.

12. The computer program product of claim 9, wherein the data array is a first data array, wherein the method further comprises:
    receiving a second data array;
    determining that the second data array has a same syndrome as the first data array;
    obtaining the error correction information for the syndrome from the cache;
    and correcting the second data array using the error correction information obtained from cache.

13. The computer program product of claim 12, wherein obtaining the error correction information from the cache includes decoding the error correction information.

14. The computer program product of claim 12, wherein obtaining the error correction information includes searching for a value of the syndrome, associated with the error correction information, in the cache.

15. The computer program product of claim 9, wherein the data array is associated with NAND flash data.

16. A computer program product for correcting data errors, said computer program product comprising:
    a computer readable storage medium;
    first program instructions to cause a computing device to receive data stored by the computer readable storage medium;
    second program instructions to cause the computing device to determine a syndrome associated with the data;
    third program instructions to cause the computing device to initiate a calculation of error correction information for the data based on the syndrome;
    fourth program instructions to cause the computing device to search for the error correction information in a cache based on the syndrome;
    fifth program instructions to cause the computing device to discontinue searching for the error correction information in the cache when the calculation of the error correction information is completed prior to finding the error correction information in the cache; and
    sixth program instructions to cause the computing device to correct an error associated with the data using the error correction information,
    wherein the first program instructions, second program instructions, third program instructions, fourth program instructions, fifth program instructions, and sixth program instructions are stored in the computer readable storage medium.

17. The computer program product of claim 16, further comprising:
    seventh program instructions executable by a computing device to cause the computing device to store the error correction information in the cache when a number of calculation cycles used to complete calculation of the error correction information exceeds a threshold.

18. The computer program product of claim 16, further comprising:
    eighth program instructions executable by a computing device to cause the computing device to encode the error correction information prior to storing the error correction information in the cache.

19. The computer program product of claim 16, wherein the calculation of the error correction information is based on at least one of a Berlekamp-Massey and Chein-Search algorithm.

20. The computer program product of claim 16, wherein the data includes NAND flash data.

* * * * *